United States Patent
Khellah et al.

(10) Patent No.: US 8,868,836 B2
(45) Date of Patent: Oct. 21, 2014

(54) REDUCING MINIMUM OPERATING VOLTAGE THROUGH HYBRID CACHE DESIGN

(75) Inventors: Muhammad M. Khellah, Tigard, OR (US); Christopher Wilkerson, Portland, OR (US); Alaa R. Alameldeen, Aloha, OR (US); Bibiche M. Geuskens, Beaverton, OR (US); Tanay Karnik, Portland, OR (US); Vivek De, Beaverton, OR (US); Gunjan H. Pandya, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 604 days.

(21) Appl. No.: 12/006,287

(22) Filed: Dec. 31, 2007

(65) Prior Publication Data

US 2009/0172283 A1    Jul. 2, 2009

(51) Int. Cl.
    *G06F 12/00* (2006.01)
(52) U.S. Cl.
    USPC ............................ 711/129; 711/154; 711/170
(58) Field of Classification Search
    USPC .......................................... 711/129, 170, 154
    See application file for complete search history.

(56) References Cited

U.S. PATENT DOCUMENTS

| | | | | |
|---|---|---|---|---|
| 6,400,126 | B1 * | 6/2002 | Zuniga et al. | 323/282 |
| 6,751,706 | B2 * | 6/2004 | Chauvel et al. | 711/122 |
| 6,792,551 | B2 * | 9/2004 | Dai | 713/320 |
| 6,976,181 | B2 * | 12/2005 | Dai et al. | 713/320 |
| 7,064,758 | B2 * | 6/2006 | Chik et al. | 345/467 |
| 7,127,560 | B2 * | 10/2006 | Cohen et al. | 711/141 |
| 7,177,981 | B2 * | 2/2007 | Davis | 711/119 |
| 7,663,961 | B1 * | 2/2010 | Rowlands et al. | 365/227 |

OTHER PUBLICATIONS

Khellah et al., "A 4.2GHz 0.3mm2 256kb Dual-V/sub cc/ SRAM Building Block in 65nm CMOS", IEEE International Solid-State Circuits Conference, ISSN: 0193-6530, Feb. 6-9, 2006, 10 pages.
Sakran et al., "The Implementation of the 65nm Dual-Core 64b Merom Processor", IEEE International Solid-State Circuits Conference, ISSN: 0193-6530,Feb. 11-15, 2007, 3 pages.
Kawaguchi et al., "A 0.5V, 400MHz, VDD-Hopping Processor with Zero-VTH FD-SOI Technology", IEEE International Solid-State Circuits Conference, ISSN: 0193-6530, Feb. 2003, 10 pages.

* cited by examiner

*Primary Examiner* — Matthew Bradley
(74) *Attorney, Agent, or Firm* — Caven & Aghevli LLC

(57) ABSTRACT

Methods and apparatus to reduce minimum operating voltage through a hybrid cache design are described. In one embodiment, a cache with different size bit cells may be used, e.g., to reduce minimum operating voltage of an integrated circuit device that includes the cache and possibly other logic (such as a processor). Other embodiments are also described.

19 Claims, 4 Drawing Sheets

REDUCING MINIMUM OPERATING VOLTAGE THROUGH HYBRID CACHE DESIGN

BACKGROUND

The present disclosure generally relates to the field of electronics. More particularly, an embodiment of the invention relates to reducing minimum operating voltage through a hybrid cache design.

With the scaling of transistor dimensions, variability in the number and location of channel dopant atoms may result in restrictive electrical deviations in the device threshold voltage. These fluctuations can generally be most prominent in minimum geometry devices, which may be used in area-limited circuits such as 6T (six-transistor) SRAM (Static Random Access Memory) cell. The mismatch in the threshold voltage between neighboring transistors within an SRAM cell may dramatically reduce the cell stability during a read or write operation. Read stability generally refers to the ability of a cell to retain its contents during a read operation while considering device mismatch. Write stability generally refers to the ability to write a cell while considering device mismatch. Further, retention stability is generally the ability of a cell to retain states during standby mode (e.g., where operating voltage is reduced but not completely turned off). To be considered stable, an SRAM cell needs be designed to meet a minimum cell stability requirement set to minimize the number of defect dies. Process scaling may make it harder to meet this requirement, since device parameter variations may become worse.

Generally, SRAM stability may dramatically degrade with the scaling of supply voltage (Vcc), needed for low-power designs. For example, in some cases, only tens of bits may fail out of millions during operation at a lower voltage, but those failing bits may determine the supply voltage level at which the entire SRAM (and other logic on the same integrated circuit (IC)) may operate, thus wasting power by operating the remaining (majority of) cells at an unnecessarily higher voltage.

Some current designs attempt to solve the stability problem through the use of a higher separate supply voltage for SRAM cells which does not scale with Vcc. Some of the drawbacks of such a scheme are extra supply generation and distribution, level shifter for data interfaces, and power management.

Accordingly, memory cell stability (such as cache memory cell stability) may be a major concern with process and supply voltage scaling.

BRIEF DESCRIPTION OF THE DRAWINGS

The detailed description is provided with reference to the accompanying figures. In the figures, the left-most digit(s) of a reference number identifies the figure in which the reference number first appears. The use of the same reference numbers in different figures indicates similar or identical items.

DETAILED DESCRIPTION

In the following description, numerous specific details are set forth in order to provide a thorough understanding of various embodiments. However, various embodiments of the invention may be practiced without the specific details. In other instances, well-known methods, procedures, components, and circuits have not been described in detail so as not to obscure the particular embodiments of the invention. Further, various aspects of embodiments of the invention may be performed using various means, such as integrated semiconductor circuits ("hardware"), computer-readable instructions organized into one or more programs ("software"), or some combination of hardware and software. For the purposes of this disclosure reference to "logic" shall mean either hardware, software, or some combination thereof.

Some of the embodiments discussed herein may provide techniques for adjusting supply of voltage to one or more domains in one or more ICs based on a determination (or indication) that power consumption by components of the corresponding domain is to be modified (e.g., lowered). In one embodiment, each IC die may include a plurality of domains. The voltage supplied to one or more components present in each domain (which may include a memory device such as a cache or a portion of a cache) may be individually adjusted (e.g., lowered, shut off, etc.). Also, a single voltage supply (that may be external to the die) may supply voltage to one or more voltage regulators that adjust the power consumption of the components within each domain in some embodiments.

In an embodiment, improving cell stability to enable low voltage operation may be achieved by increasing cell area for at least some cells, for example, to mitigate random dopant fluctuations. Some embodiments may improve (e.g., reduce) SRAM active and retention operating minimum voltage (Vccmin) with moderate area increase. Additionally, some embodiments may be provided in various environments, such as those discussed with reference to FIGS. 1-5.

Figure 1:
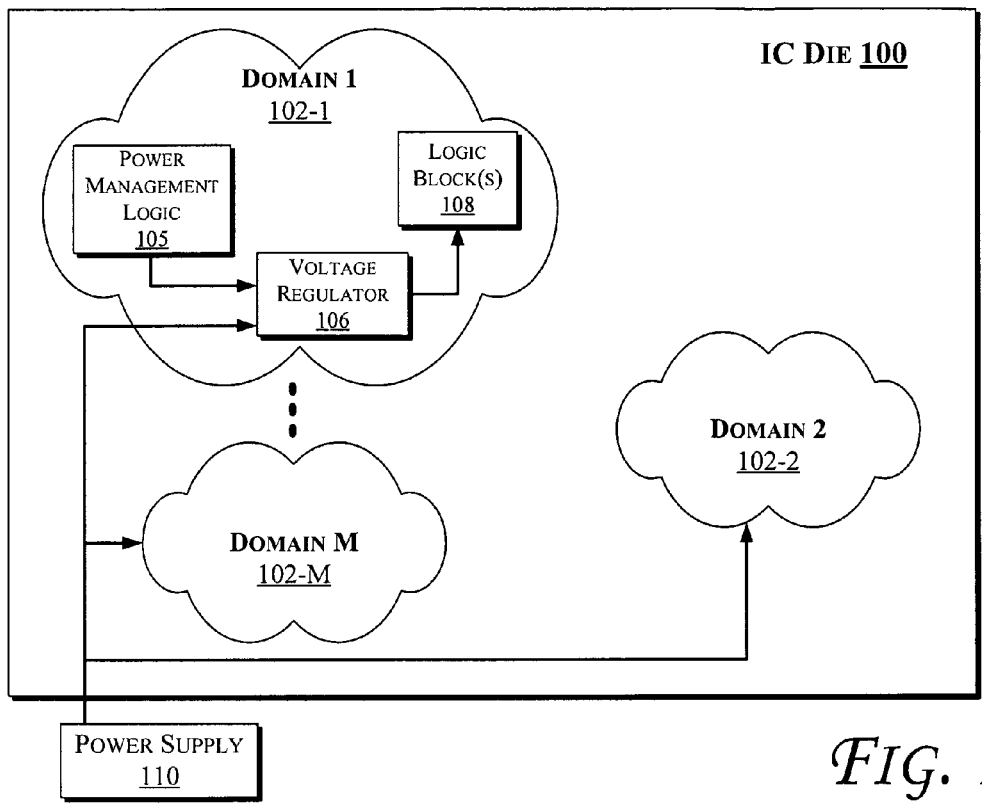
FIG. 1 illustrates a block diagram of domains and other logic that may be present on an integrated circuit (IC) die, according to an embodiment.

In particular, FIG. 1 illustrates a block diagram of domains and other logic that may be present on an IC die 100, according to an embodiment. The die 100 may include one or more domains 102-1 through 102-M. Each of the domains 102-1 through 102-M may include various components, but for clarity, sample components are only shown with reference to the domain 102-1.

Figure 2:
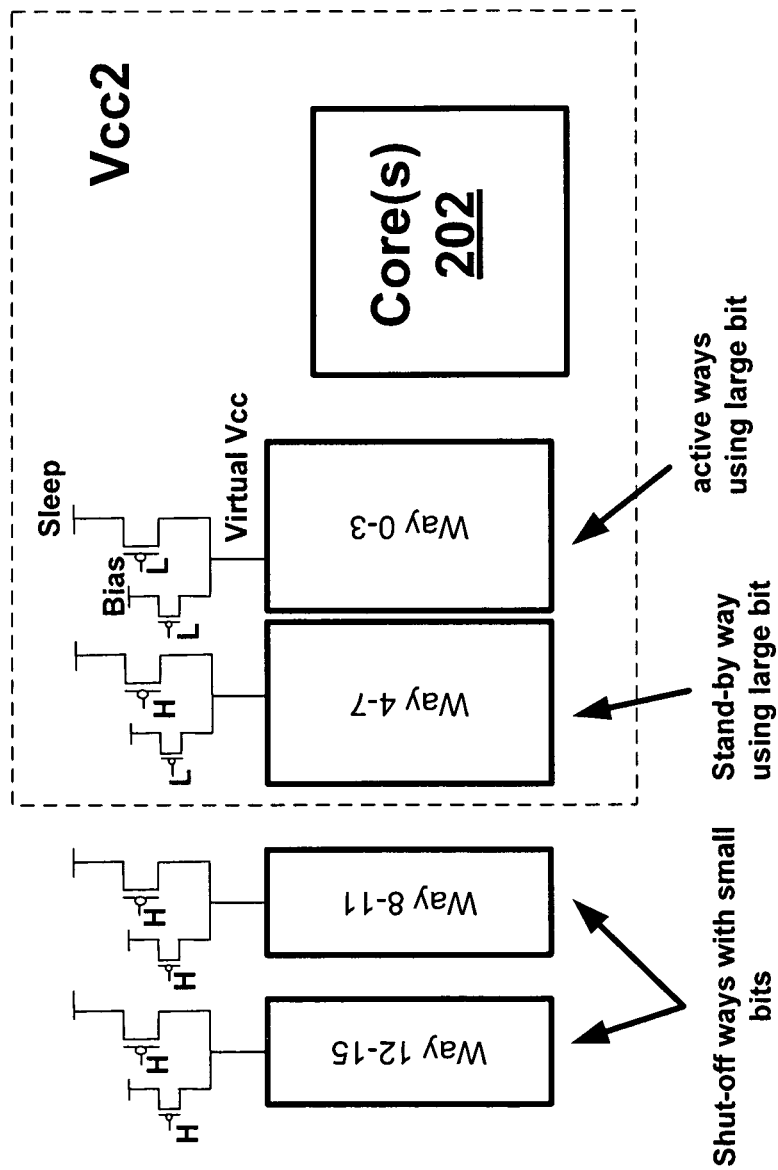
FIG. 2 illustrates a block diagram of a hybrid cache design using two cell combinations, in accordance with an embodiment.

As illustrated in FIG. 1, each domain may include a power management logic 105 (e.g., to determine when and whether to cause adjustment to supply voltage), a voltage regulator 106 (e.g., which may adjust supplied voltage in accordance with a signal generated by the power management logic 105), and one or more logic blocks 108 (including, for example, one or more cache devices, processor cores, etc.). The power management logic 105 may utilize various type of information to cause adjustment(s) to the target operating voltage of one or more of the logic blocks 108. The voltage regulator 106 may adjust the supply of power provided by a power supply 110 (which may be external to the IC die 100 in one embodiment) to one or more components of the corresponding domain such as one or more of the logic blocks 108. In an embodiment, the voltage regulator 106 may include a power gating transistor (such as a power metal-oxide semiconductor field-effect transistor (MOSFET)), which may be utilized as a linear regulator by modulating its gate impedance. The voltage regulator 106 may also include inductors, capacitors, etc. An embodiment of the voltage regulator 106 is illustrated in FIG. 2 as pairs of transistors coupled to various cache ways.

In one embodiment, the power management logic 105 may determine whether the power consumption by one or more components of each of the plurality of domains 102 is to be modified based on one or more of an efficiency demand and/or a performance demand. Efficiency and/or performance demands may be configured by various techniques, such as predefined threshold values, analysis of input vectors or values, etc. Accordingly, the power management logic 105 may cause dynamic adjustments to voltage levels supplied to the logic block(s) 108 by the voltage regulator 106.

In various embodiments, some of the events that may trigger DVS (Dynamic Voltage and Frequency Scaling) include: (1) increased die heat. Based on feedback from the on-die thermal sensor(s), the system may decide to apply DVS to reduce or prevent likelihood of overheating; (2) based on load or application, the system may scale voltage and frequency down to allow power reduction; (3) in a multi-core system, more than one processor core may be active for higher performance. To allow this parallel processing without causing overheating, etc, DVS may be applied. Furthermore, with the hybrid cache approach discussed here, banks using the small cell(s) may be shut-off in order to be able to operate at the lower supply voltage. When a microprocessor transitions to this low power mode, all cache lines using small cells may be flushed from the cache (e.g., stored in a main memory such as memory 412 of FIG. 4) before shutting off that portion of the cache.

In some embodiments, a single power management logic (e.g., logic 105) and/or voltage regulator (e.g., regulator 106) may be used for more than one of the domains shown in FIG. 1. Furthermore, the die 100 may be provided in one or more components of the systems 400 of FIG. 4 and/or 500 of FIG. 5 in various embodiments.

FIG. 2 illustrates a block diagram of a hybrid cache design using two cell combinations, in accordance with an embodiment. In one embodiment, one or more of the components shown in FIG. 2 may be present on an IC such as the IC 100 of FIG. 1. Also, one or more of the components shown in FIG. 2 may be present on different ICs in some embodiments. As shown in FIG. 2, one or more cache ways (e.g., cache ways 0-3 and 4-7) may be operating at the same Vcc as one or more cores 202.

For example, cache ways with smaller size bit cells (e.g., cache ways 8-11 and 12-15 which may be 10 to 100 percent smaller than the largest cells) may be shut off in one embodiment (e.g., as illustrated by the high inputs to the transistors shown above these cache ways) to lower power consumption and enable operation of the remaining logic fed by the same power supply and/or regulator (such as discussed with reference to FIG. 1) at a lower voltage. As such, cache ways with larger size bit cells than cache ways 8-11 and 12-15 (e.g., cache ways 0-3 and 4-7) may remain active or enter stand-by mode selectively (as illustrated by the inputs to the transistors shown above these cache ways that may control the state (e.g., active, shut-off, standby, etc.) of the cache ways. Also, more than two bit cell sizes may be utilized in some embodiments. For example, during some operation modes, the portion of cache with the largest bit cells may be maintained in an active state, with the smallest bit cells being shut off, and the medium size bit cells being in standby mode. In another example, in case all the cache is needed by a given application, then the voltage is limited by the smallest cell. If only the small and medium cells are needed, then it is limited by the medium cell, and so on. Other configurations may also be used.

In an embodiment, a hybrid cache design where a cache (such as a level 1 (L1) cache, level 2 (L2) cache, mid-level cache (MLC), last-level cache (LLC), etc) is composed of multiple cell types of different area each and thus Vccmin may be used. In some embodiments, the hybrid cache (HC) design allows reduction not only in leakage power (e.g., by shutting off unused cache portion) but also in active Vccmin (e.g., beyond what other existing designs may offer). Without loss of generality (taking an L2 cache as an example rather than a limitation), let's assume that the HC is composed of two cells: small cell operating at active Vcc1 and large cell operating at active Vcc2, where Vcc2<Vcc1. There are two usage scenarios:

(a) If the whole cache is needed by the processor, then active Vccmin of the cache and so the processor may be set by the combinations of bits used as follows:

$$L2\_Failure_{original} = N \times P_{FAIL\_small}(Vcc1)$$

$$L2\_Failure_{hybrid\_all} = N_{small} \times P_{FAIL\_small}(Vcc^*) + N_{large} \times P_{FAIL\_large}(Vcc^*),$$

where N=Nsmall+Nlarge and PFAIL_small(Vcc1) is the failure probability of the small cell at Vcc1. By mixing small and large bits, one may operate at Vcc* such as Vcc2<Vcc*<Vcc1 at equal L2_Failure rate to the original system. Thus a HC design may allow intermediate Vccmin between that of the small cell and the large cell.

(b) If only part of the cache is needed by the core, then one may shut-off all parts using the small cell to cut leakage and keep powered some or all parts using the large cell. Thus the core voltage may be scaled to Vcc2 as set by the large bit and L2_failure is given by:

$$L2\_Failure_{hybrid\_partial} = M \times P_{FAIL\_large}(Vcc2),$$

where M is the number of bits in the reduced (partial) L2 cache such as M≤Nlarge<N. This is unlike other current cache schemes where L2 may use one cell type (say the small cell) and thus its active voltage may not be scaled beyond Vcc1 after disabling some of its ways. Operating the core and cache on Vcc2 may result in significant power savings. Furthermore, it is proposed that in some embodiments by just going to the smaller cache size, it is possible to reduce Vccmin beyond Vcc2 as given by:

$$L2\_Failure_{hybrid\_partial} = M \times P_{FAIL\_large}(Vcc2^+)$$

The reduction in the number of bits from N to M may relax PFAIL_large by the same ratio thus allowing cache to operate at Vcc2+<Vcc2. Further the discussion herein may refer to L2 caches but is equally applicable to other types of caches or memory units discussed herein that may be present on an IC.

Figure 3:
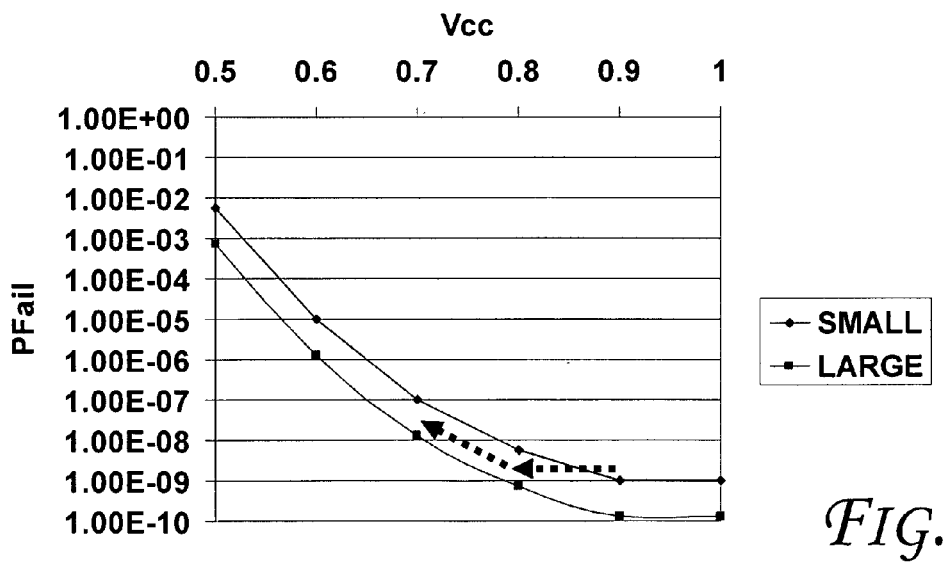
FIG. 3 shows example active Vccmin vs. PFAIL for a given SRAM cell, according to an embodiment.

Moreover, FIG. 3 shows example (normalized) active Vccmin vs. PFAIL for a given SRAM cell, according to an embodiment. More specifically, FIG. 3 shows that a 10× reduction in bit failure probability (and so cache size) may provide about 100 mV reduction in Vccmin. This is in addition to a 100 mV reduction obtained by going from the small to the large cell. In summary, in a partial HC usage model, L2 active Vccmin (and so core Vcc) is set by active Vccmin of the large cell taking into advantage the additional Vccmin reduction using the smaller cache size in some embodiments.

Figure 4:
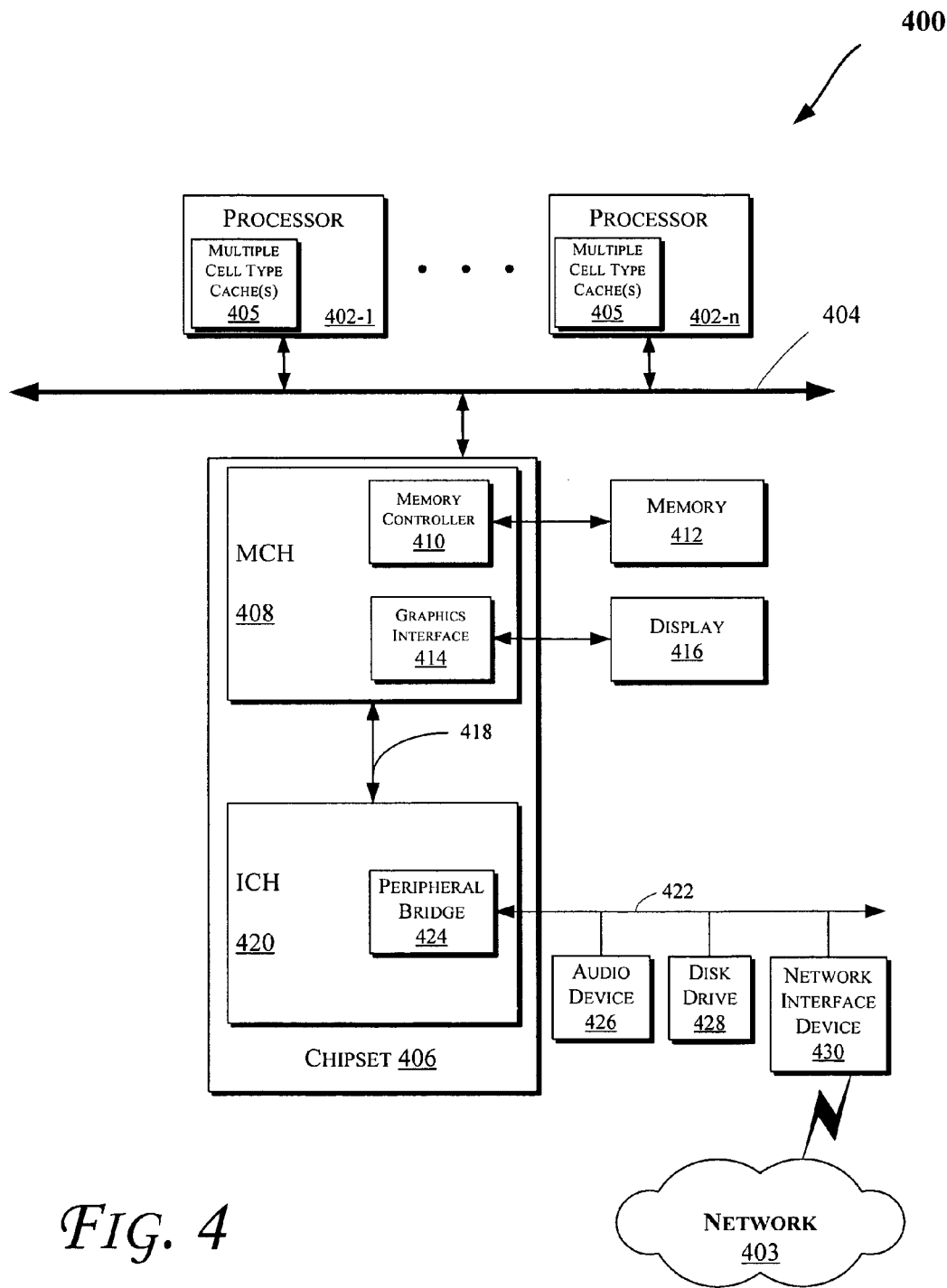
FIGS. 4 and 5 illustrate block diagrams of computing systems in accordance with various embodiments of the invention.

FIG. 4 illustrates a block diagram of a computing system 400 in accordance with an embodiment of the invention. The computing system 400 may include one or more central processing unit(s) (CPUs) 402 or processors that communicate via an interconnection network (or bus) 404. The processors 402 may include a general purpose processor, a network processor (that processes data communicated over a computer network 403), or other types of a processor (including a reduced instruction set computer (RISC) processor or a complex instruction set computer (CISC)). Moreover, the processors 402 may have a single or multiple core design. The processors 402 with a multiple core design may integrate different types of processor cores on the same IC die (such as dies 100 and 200 of FIGS. 1 and 2). Also, the processors 402 with a multiple core design may be implemented as symmetrical or asymmetrical multiprocessors. In an embodiment, one or more of the processors 402 may be provided in the logics shown in FIGS. 1 and 2. Also, the operations discussed with reference to FIGS. 1-3 may be performed by one or more components of the system 400.

A chipset 406 may also communicate with the interconnection network 404. The chipset 406 may include a memory control hub (MCH) 408. The MCH 408 may include a memory controller 410 that communicates with a memory 412. The memory 412 may store data, including sequences of instructions, that are executed by the CPU 402, or any other device included in the computing system 400. In one embodiment of the invention, the memory 412 may include one or more volatile storage (or memory) devices such as random access memory (RAM), dynamic RAM (DRAM), synchronous DRAM (SDRAM), static RAM (SRAM), or other types of storage devices. Nonvolatile memory may also be utilized such as a hard disk. Additional devices may communicate via the interconnection network 404, such as multiple CPUs and/or multiple system memories.

The MCH 408 may also include a graphics interface 414 that communicates with a display device 416. In one embodiment of the invention, the graphics interface 414 may communicate with the display device 416 via an accelerated graphics port (AGP). In an embodiment of the invention, the display 416 (such as a flat panel display) may communicate with the graphics interface 414 through, for example, a signal converter that translates a digital representation of an image stored in a storage device such as video memory or system memory into display signals that are interpreted and displayed by the display 416. The display signals produced by the display device may pass through various control devices before being interpreted by and subsequently displayed on the display 416.

A hub interface 418 may allow the MCH 408 and an input/output control hub (ICH) 420 to communicate. The ICH 420 may provide an interface to I/O device(s) that communicate with the computing system 400. The ICH 420 may communicate with a bus 422 through a peripheral bridge (or controller) 424, such as a peripheral component interconnect (PCI) bridge, a universal serial bus (USB) controller, or other types of peripheral bridges or controllers. The bridge 424 may provide a data path between the CPU 402 and peripheral devices. Other types of topologies may be utilized. Also, multiple buses may communicate with the ICH 420, e.g., through multiple bridges or controllers. Moreover, other peripherals in communication with the ICH 420 may include, in various embodiments of the invention, integrated drive electronics (IDE) or small computer system interface (SCSI) hard drive(s), USB port(s), a keyboard, a mouse, parallel port(s), serial port(s), floppy disk drive(s), digital output support (e.g., digital video interface (DVI)), or other devices.

The bus 422 may communicate with an audio device 426, one or more disk drive(s) 428, and a network interface device 430 (which is in communication with the computer network 403). Other devices may communicate via the bus 422. Also, various components (such as the network interface device 430) may communicate with the MCH 408 via a high speed (e.g., general purpose) I/O bus channel in some embodiments of the invention. In addition, the processor 402 and the MCH 408 may be combined to form a single chip. Furthermore, a graphics accelerator may be included within the MCH 408 in other embodiments of the invention.

Furthermore, the computing system 400 may include volatile and/or nonvolatile memory (or storage). For example, nonvolatile memory may include one or more of the following: read-only memory (ROM), programmable ROM (PROM), erasable PROM (EPROM), electrically EPROM (EEPROM), a disk drive (e.g., 428), a floppy disk, a compact disk ROM (CD-ROM), a digital versatile disk (DVD), flash memory, a magneto-optical disk, or other types of nonvolatile machine-readable media that are capable of storing electronic data (e.g., including instructions).

Figure 5:
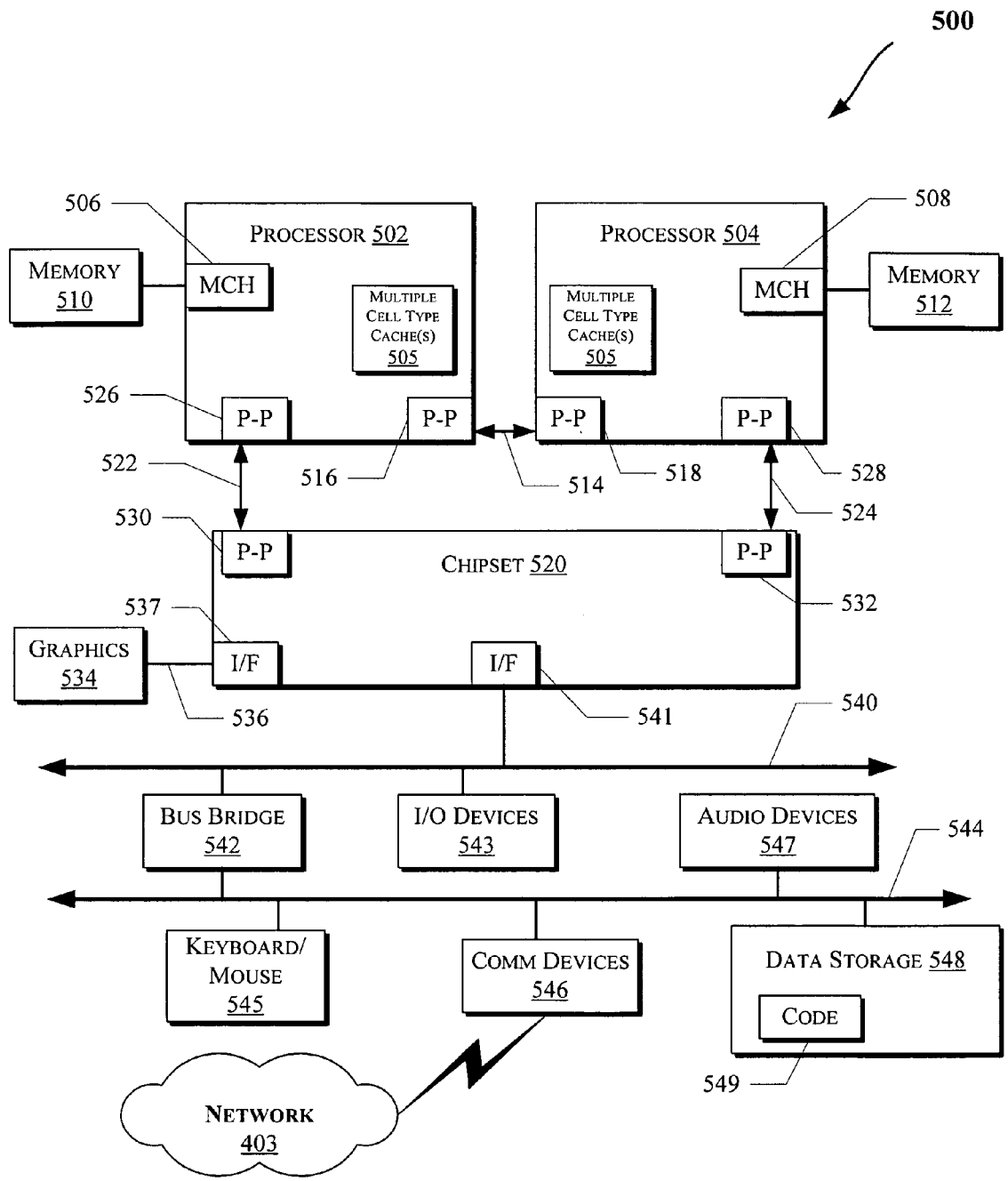

FIG. 5 illustrates a computing system 500 that is arranged in a point-to-point (PtP) configuration, according to an embodiment of the invention. In particular, FIG. 5 shows a system where processors, memory, and input/output devices are interconnected by a number of point-to-point interfaces. The operations discussed with reference to FIGS. 1-4 may be performed by one or more components of the system 500.

As illustrated in FIG. 5, the system 500 may include several processors, of which only two, processors 502 and 504 are shown for clarity. The processors 502 and 504 may each include a local memory controller (MC) 506 and 508 to enable communication with memories 510 and 512. The memories 510 and/or 512 may store various data such as those discussed with reference to the memory 412 of FIG. 4.

In an embodiment, the processors 502 and 504 may be one of the processors 402 discussed with reference to FIG. 4. The processors 502 and 504 may exchange data via a point-to-point (PtP) interface 514 using PtP interface circuits 516 and 518, respectively. Further, the processors 502 and 504 may include a high speed (e.g., general purpose) I/O bus channel in some embodiments of the invention to facilitate communication with various components (such as I/O device(s)). Also, the processors 502 and 504 may each exchange data with a chipset 520 via individual PtP interfaces 522 and 524 using point-to-point interface circuits 526, 528, 530, and 532. The chipset 520 may further exchange data with a graphics circuit 534 via a graphics interface 536, e.g., using a PtP interface circuit 537.

At least one embodiment of the invention may be provided within the processors 502 and 504. For example, one or more of the components discussed with reference to FIGS. 1-2 may be provided on the dies 100 and 200, respectively, in conjunction with the processors 502 and/or 504. Other embodiments of the invention, however, may exist in other circuits, logic units, or devices within the system 500 of FIG. 5. Furthermore, other embodiments of the invention may be distributed throughout several circuits, logic units, or devices illustrated in FIG. 5.

The chipset 520 may communicate with a bus 540 using a PtP interface circuit 541. The bus 540 may communicate with one or more devices, such as a bus bridge 542 and I/O devices 543. Via a bus 544, the bus bridge 542 may communicate with other devices such as a keyboard/mouse 545, communication devices 546 (such as modems, network interface devices, or other communication devices that may communicate with the computer network 403), audio I/O device 547, and/or a data storage device 548. The data storage device 548 may store code 549 that may be executed by the processors 502 and/or 504.

Further, as shown in FIGS. 4 and 5, each processor may include one or more cache with multiple cell types (e.g., items 405 and/or 505) such as the caches discussed with reference to FIGS. 1-3.

In various embodiments of the invention, the operations discussed herein, e.g., with reference to FIGS. 1-5, may be implemented as hardware (e.g., logic circuitry), software, firmware, or combinations thereof, which may be provided as a computer program product, e.g., including a machine-readable or computer-readable medium having stored thereon instructions (or software procedures) used to program a computer to perform a process discussed herein. The machine-readable medium may include a storage device such as those discussed herein.

Additionally, such computer-readable media may be downloaded as a computer program product, wherein the program may be transferred from a remote computer (e.g., a server) to a requesting computer (e.g., a client) by way of data signals embodied in a carrier wave or other propagation medium via a communication link (e.g., a bus, a modem, or a network connection).

Reference in the specification to "one embodiment," "an embodiment," or "some embodiments" means that a particular feature, structure, or characteristic described in connection with the embodiment(s) may be included in at least an implementation. The appearances of the phrase "in one embodiment" in various places in the specification may or may not be all referring to the same embodiment. Also, in the description and claims, the terms "coupled" and "connected," along with their derivatives, may be used. In some embodiments of the invention, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An apparatus comprising:
a cache comprising a first plurality of bit cells each bit cell having a first cell area size and a second plurality of bit cells each bit cell having a second cell area size;
one or more processor cores coupled to the cache; and
logic to cause modification to supply of voltage to the first and second plurality of bit cells,
wherein the first cell area size and the second cell area size are different.

2. The apparatus of claim 1, wherein the first size is smaller than the second size and the logic is to cause the first plurality of bit cells to be shut off.

3. The apparatus of claim 2, wherein the logic is to further cause reduction to the supply of voltage to the second plurality of bit cells.

4. The apparatus of claim 2, wherein the logic is to further cause a first portion of the second plurality of bit cells to enter a standby mode and cause a second portion of the second plurality of bit cells to remain active at a reduced level of the supply voltage.

5. The apparatus of claim 1, wherein the logic comprises a voltage regulator coupled to a power supply, wherein the voltage regulator is to modify the supply of voltage.

6. The apparatus of claim 5, wherein the voltage regulator comprises a plurality of transistors coupled between the cache and the power supply.

7. The apparatus of claim 1, wherein the logic is to modify a supply of voltage to at least one of the one or more processor cores.

8. The apparatus of claim 1, further comprising a processor that comprises the one or more processor cores and the cache.

9. The apparatus of claim 1, wherein the cache comprises a third plurality of bit cells having a third size which is different than either the first size or the second size.

10. The apparatus of claim 9, wherein the logic is to cause modification to supply of voltage to the first, second, and third plurality of bit cells.

11. A computing system comprising:
a power supply; and
one or more semiconductor dies coupled to the power supply, at least one of the one or more dies to comprise one or more of:
a first domain to comprise a cache to store data, wherein the cache comprises bit cells having different cell area sizes;
a second logic to determine whether a voltage supplied to a first logic is to be modified; and
a voltage regulator to adjust a supply of voltage to the first logic in accordance with a first signal caused to be generated by the second logic.

12. The system of claim 11, wherein the voltage regulator is to shut off voltage supplied to a first plurality of the bit cells of the cache that have a smaller size than a second plurality of the bit cells of the cache that have a larger size than the first plurality of bit cells.

13. The system of claim 12, wherein the voltage regulator is to reduce the supply of voltage to the second plurality of bit cells.

14. The system of claim 12, wherein the voltage regulator is to cause a first portion of the second plurality of bit cells to enter a standby mode and to cause a second portion of the second plurality of bit cells to remain active at a reduced level of the supply voltage.

15. The system of claim 11, wherein the voltage regulator comprises a plurality of transistors coupled between the cache and the power supply.

16. The apparatus of claim 1, wherein the first cell area size and the second cell area size are to differ by 10 to 100 percent.

17. The system of claim 11, wherein the different cell area sizes are to differ by 10 to 100 percent.

18. The apparatus of claim 1, wherein the first cell area size and the second cell area size correspond to different bit cell types.

19. The system of claim 11, wherein the first size and the second size correspond to different bit cell types.

* * * * *